United States Patent [19]

Eaton, Jr.

[11] 4,354,123
[45] Oct. 12, 1982

[54] HIGH VOLTAGE CLOCK GENERATOR

[75] Inventor: Sargent S. Eaton, Jr., Colorado Springs, Colo.

[73] Assignee: Mostek Corporation, Carrollton, Tex.

[21] Appl. No.: 66,148

[22] Filed: Aug. 13, 1979

[51] Int. Cl.³ .............................................. H03K 4/24
[52] U.S. Cl. .................................. 307/475; 307/264; 307/270; 307/482
[58] Field of Search ............... 307/205, 208, 264, 269, 307/270, 304, DIG. 1, DIG. 4, 453, 482, 475

[56] References Cited

U.S. PATENT DOCUMENTS

| | | | |
|---|---|---|---|
| 3,774,055 | 11/1973 | Bapat | 307/DIG. 4 |
| 3,988,617 | 10/1976 | Price | 307/270 |
| 4,042,838 | 8/1977 | Street et al. | 307/DIG. 4 |
| 4,049,978 | 9/1977 | Dru et al. | 307/DIG. 4 |
| 4,061,933 | 12/1977 | Schroeder et al. | 307/270 X |
| 4,122,361 | 10/1978 | Clemen et al. | 307/269 X |

Primary Examiner—Eugene R. LaRoche

[57] ABSTRACT

A high voltage clock generator including an isolation and precharge circuit to charge a bootstrap capacitance at a time prior to driving the load capacitance to a higher voltage level. The first clock generator charges a load capacitance to the initial voltage level while the isolation precharge circuit has already acted to charge the bootstrap capacitance. A second clock generator drives the bootstrap capacitance to a higher voltage level, at which time the isolation precharge circuit acts to engage the bootstrap capacitance to the load capacitance and charge the load capacitance to a higher voltage level.

8 Claims, 3 Drawing Figures

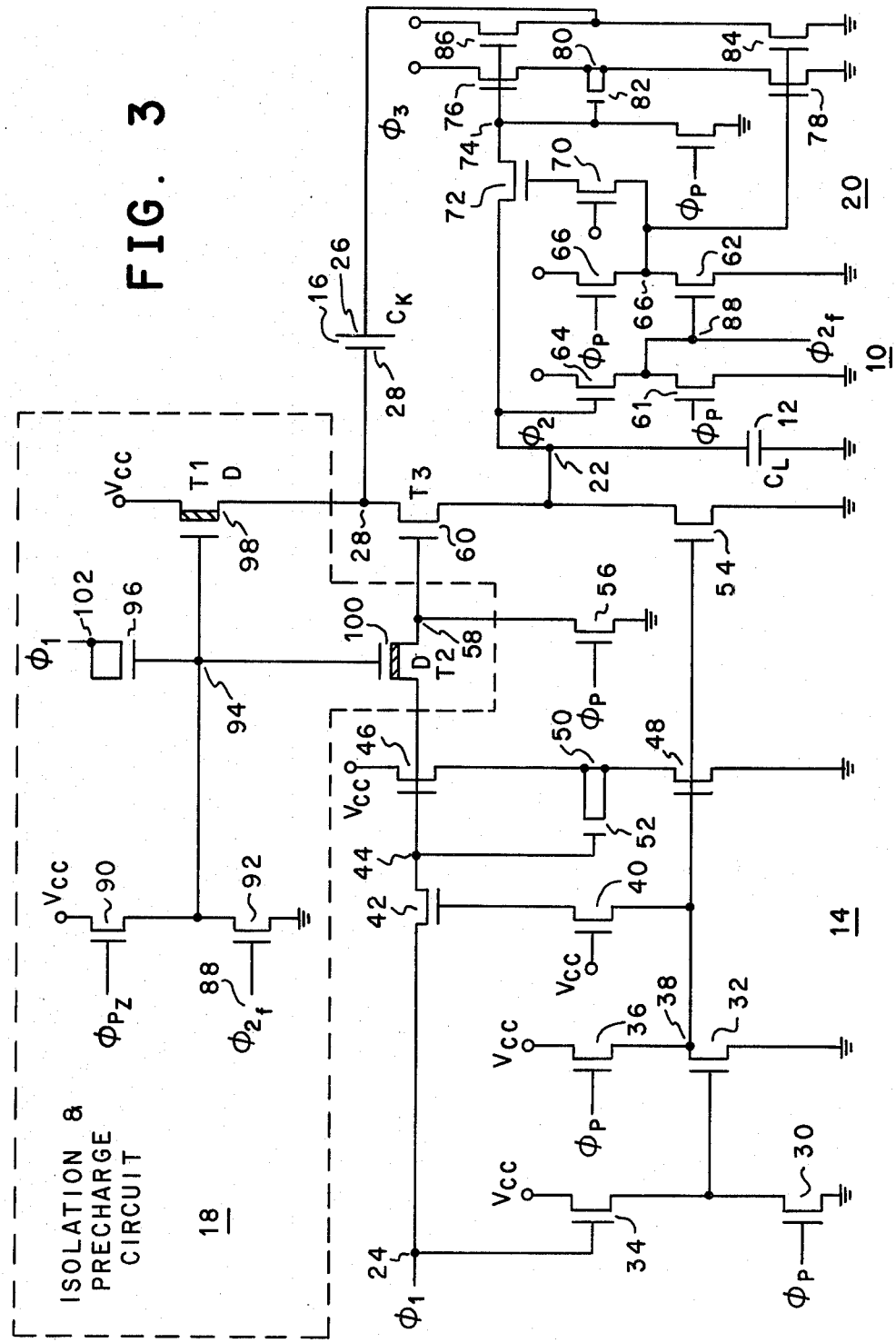

HIGH VOLTAGE CLOCK GENERATOR

FIELD OF THE INVENTION

The field of the invention relates to field effect transistor circuits and more particularly to a high voltage clock generator.

BACKGROUND OF THE INVENTION

In a memory circuit, it is often desirable to use clock lines whose maximum voltage is greater than the supply voltage $V_{cc}$. Typically, these clock lines are loaded by large capacitances which make it difficult for them to be driven above $V_{cc}$. The prior art shows the use of a bootstrap capacitance which is always fully charged and discharged as the load capacitance is. In these circuits, the bootstrap capacitance is tied directly to the load capacitance.

SUMMARY OF THE INVENTION

The present invention charges the bootstrap capacitance and the load capacitance independently. In this manner, the bootstrap capacitance delivers charge only when activated. During precharge, only the amount of charge lost during the active cycle is required to be replenished. Therefore, both speed of operation and consumption of power are improved.

An isolation and precharge circuit acts to keep the charge on the bootstrap capacitance fully charged, only to be triggered when operation of the active cycle turns off the isolation transistors and allows the bootstrap capacitance to float up above $V_{cc}$ and drive the load capacitance to a higher voltage level. After this event, and during precharge, the isolation circuit again acts to avoid losing charge from the bootstrap capacitance. Thus, charge is maintained on the bootstrap capacitance while speed is improved because the active operation of the circuit needs only drive the load capacitance before it is bootstrapped to a higher voltage level by the engagement of the bootstrap capacitance.

DESCRIPTION OF THE DRAWINGS

FIG. 3 shows a schematic diagram of a preferred embodiment of the present invention.

DESCRIPTION OF THE PREFERRED EMBODIMENT

Figure 1:
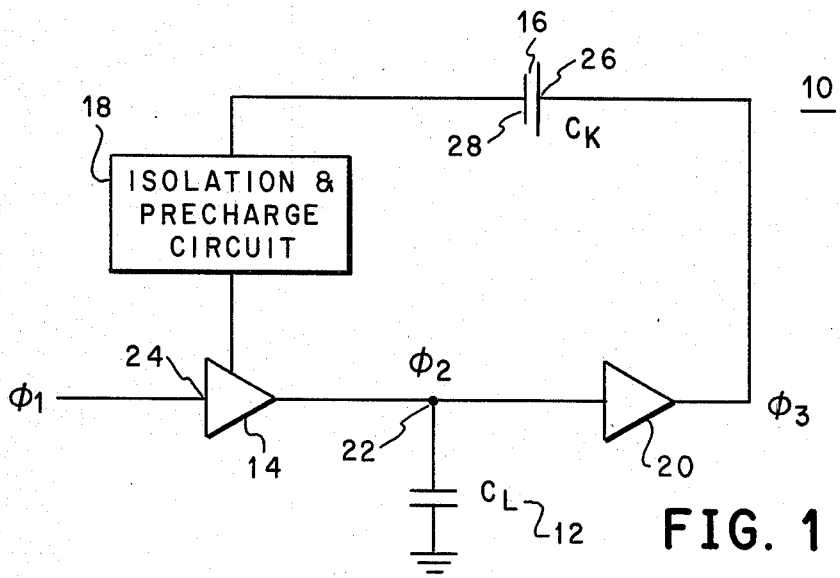
FIG. 1 shows a block diagram of the present invention.

Referring now to FIG. 1, a high voltage clock generator 10 is shown. A load capacitance 12 is shown as $C_L$, which is representative of any capacitance found in a load. In the preferred embodiment to be described herein, $C_L$ represents the load capacitance of a memory circuit word line. A first clock generator 14 is shown, which is used to charge the load capacitance 12 to a first voltage level, approximately 5 volts. A bootstrap capacitance 16 is shown labeled $C_K$. This capacitance is used to drive the load capacitance to the second higher voltage level desired.

An isolation and precharge circuit is shown by Block 18. This circuit charges the bootstrap capacitance 16 to the first voltage level of 5 volts at a time prior to driving the load capacitance 12 to the second voltage level. The bootstrap capacitance 16 could be charged to any voltage level although its effect on the load capacitance will vary accordingly. In the preferred embodiment, the bootstrap capacitance 16 is approximately equal to the load capacitance although the bootstrap capacitance could be chosen at any level desired. The isolation and precharge circuit 18 and the second clock generator 20 act to charge the bootstrap capacitance 16. Note that only two clock generators are shown here although numerous clock generators could be cascaded to achieve further driving capabilities if desired.

The operation of the high voltage clock generator will now be described. At an initial time, the top plate 22 of the load capacitance 12 will be at 0 volts. This has been designated as $\phi_2$. Similarly, $\phi_1$ at the input 24 to the first clock generator 14 will be at 0, and $\phi_3$ at the base plate 26 of the bootstrap capacitance 16 will be at 0. At this time the isolation and precharge circuit charges the top plate 28 of the bootstrap capacitance 16 to a first voltage level such as 5 volts.

Figure 2:
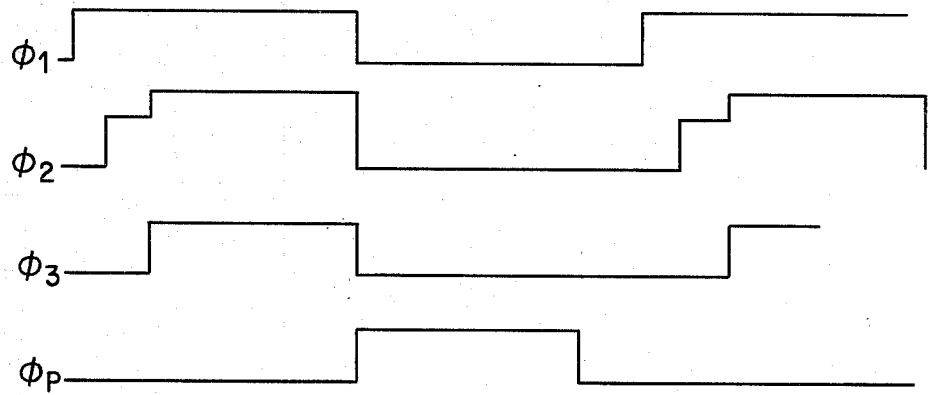
FIG. 2 shows a timing diagram according to the present invention.

The further operation of the circuit may now be seen by referring to the timing diagram shown in FIG. 2. $\phi_1$ initially goes to a first voltage level and will drive the top plate 22 of the load capacitance 12 to the first voltage level. During this time the isolation and pre-charge circuit 18 is isolating the bootstrap capacitance 16. $\phi_3$ at the base plate of the bootstrap capacitance 16 remains at 0. The $\phi_2$ at plate 22 of the load capacitance 12 follows with a short delay after the $\phi_1$ goes to the first voltage level.

A further delay follows before $\phi_3$ rises to the first voltage level, at which time the bootstrap capacitance base plate 26 is driven up with $\phi_3$. At the same time, the isolation and precharge circuit acts to connect the bootstrap capacitance to the load capacitance 12. $\phi_2$ will accordingly jump depending on the charge on the bootstrap capacitance 16. When the two capacitances are approximately equal as in the preferred embodiment, $\phi_2$ will rise approximately ½, or to 7.5 volts in this instance.

As the high voltage clock generator enters back into its pecharged stage, $\phi_1$, $\phi_2$ and $\phi_3$ will again return to 0, but the isolation and precharge circuit 18 will operate to maintain a charge presently on bootstrap capacitance 16. This avoids the necessity of having to completely recharge bootstrap capacitance 16 each cycle and thereby allows faster operation of the circuit. Further, power consumption is significantly reduced.

Referring now to FIG. 3, the high voltage clock generator 10 may be observed in more detail. During the precharge stage, the transistor 30 is turned on, bringing the gate of transistor 32 to ground. Transistor 32 is thereby turned off, as is transistor 34, due to $\phi_1$ at input 24, which is tied to the gate of transistor 34, being at ground. However, transistor 36 is turned on by the precharge signal, which raises node 38 to $V_{cc}-V_t$, $V_{cc}$ being the supply voltage and $V_t$ being the threshold voltage. Transistor 40 is turned on by the supply voltage and thereby draws the gate of transistor 42 to $V_{cc}-V_t$. This turns on transistor 42, which places node 44 at 0 volts. Transistor 46 does not turn on due to the zero voltage at its gate, node 44, while transistor 48 is turned on due to the voltage at node 38. In this manner, the base plate 50 of capacitor 52 is at zero volts as is node 44, the top plate of capacitor 52. Transistor 54 is also turned on by the positive voltage at node 38, and accordingly draws $\phi_2$ at node 22 to ground. Also, transistor 56 is turned on due to the precharge signal at its gate, thereby drawing node 58 to ground. Finally, transistor 60 is nonconductive because its gate, node 58, is at ground.

The second clock generator 20 has the same configuration and acts in the same manner during the precharge. Transistor 61 will be turned on, turning off transistor 62. Transistor 64 will be off, while transistor 66 is on, drawing node 68 to $V_{cc} - V_t$. Transistor 70 is on, turning on transistor 72, which puts node 74 at zero volts. Transistor 76 is thereby turned off. Transistor 78 is on, pulling the base 80 of the capacitor 82 to ground. Transistor 84 is on, while transistor 86 is off, pulling $\phi_3$ and the base plate 26 of bootstrap capacitance 16 to ground.

During precharge transistor 90 has been turned on, while transistor 92 is off. Transistor 92 receives a signal and a slight delay from node 88, which is the drain of transistor 61 and the gate of transistor 62. In this manner, node 94 is at $V_{cc} - V_t$, which charges the capacitance 96 and turns on transistors 98 and 100. Note that the transistors 98 and 100 are depletion mosfets. Node 28 is thereby drawn to $V_{cc}$ while transistor 60 operates to isolate node 22 from node 28. Thus the bootstrap capacitance 16 is charged to $V_{cc}$ or 5 volts while the load capacitance 12 remains at zero volts.

As $\phi_1$ rises to $V_{cc}$, node 24 is brought to $V_{cc}$ while plate 102 of the capacitor 96 is also brought to $V_{cc}$. At the same time, the precharge signal returns to zero volts. In this manner, the transistor 34 is turned on, while the transistor 30 is turned off. This turns on transistor 32, bringing node 38 to ground. Transistor 36 has been turned off, but transistor 40 remains on. Due to the inherent capacitance in transistor 40 and the gate of transistor 42, transistor 42 will cut off at some delay. Transistors 48 and 54 will now be turned off, while node 44 will have been charged to $V_{cc}$. At the same time, transistor 46 has been turned on, bringing plate 50 of capacitor 52 to $V_{cc}$. Finally, transistor 56 is off, while transistor 60 has been turned on, bringing $\phi_2$ at node 22 to $V_{cc}$ since nodes 44 and 58 are bootstraped above $V_{cc}$.

The clock generator 20 has acted in the same fashion to bring $\phi_3$ at node 26 to $V_{cc}$, although at some delay which can be seen on the timing diagram, FIG. 2. The signal taken at node 88 from the second clock generator 20 and tied to the gate of the transistor 92 in the isolation precharge circuit 18 has now acted to turn on the transistor 92 while transistor 90 has been turned off. Node 94 is thereby brought to ground turning off transistors 98 and 100. Because of depletion transistors, this occurs at some delay, causing a short hesitation before the bootstrap capacitance 16 is added to the load capacitance 12. $\phi_2$ is then kicked above $V_{cc}$ through $C_K$, 16. Where $C_K$, 16, and $C_L$, 12, are approximately equal, $\phi_2$ will be brought to approximately 7 to 7.5 volts.

Now, during the next precharge, $C_K$ will again be isolated from $C_L$. In this manner, $\phi_2$ needs only charge $C_L$ and the precharge circuit has acted to charge $C_K$ only the necessary amount. $C_K$ has not been fully discharged, and will retain its charge. Thus, power is conserved. Further, because $\phi_2$ need only charge $C_L$, the speed of operation is increased, as the time constant is proportionate to the capacitance.

While the invention has been particularly shown and described in reference to preferred embodiments thereof, it will be understood by those skilled in the art that various changes in form and details may be made therein without departing from the spirit and scope of the invention.

What is claimed is:

1. A high voltage clock generator comprising:
   a first clock generator to charge a load capacitance to a first voltage level;
   a bootstrap capacitance having a base plate and a top plate;
   an isolation and precharge circuit to charge the top plate of the bootstrap capacitance at a time prior to driving the load capacitance to a second voltage level; and
   a second clock generator to drive the base plate of the bootstrap capacitance such that the load capacitance is driven to the second voltage level.

2. The high voltage clock generator of claim 1 wherein the first clock generator comprises:
   a first MOSFET with its source grounded, and its gate tied to a precharge signal;
   a second MOSFET with its source tied to the drain of the first MOSFET, its drain tied to a voltage supply, and its gate tied to a first clock signal;
   a third MOSFET with its gate tied to the drain of the first MOSFET and its source grounded;
   a fourth MOSFET with its source tied to the drain of the third MOSFET, its drain tied to a voltage supply, and its gate tied to a precharge signal;
   a fifth MOSFET with its source tied to the drain of the third MOSFET, and its gate tied to a voltage supply;
   a sixth MOSFET with its drain tied to a first clock signal and its gate tied to the drain of the fifth MOSFET;
   a seventh MOSFET with its source grounded and its gate tied to the drain of the third MOSFET;
   a capacitance with a first terminal tied to the source of the sixth MOSFET and a second terminal tied to the drain of the seventh MOSFET;
   an eighth MOSFET with its gate tied to the source of the sixth MOSFET, its source tied to the second terminal of the capacitance, and its drain tied to a supply voltage;
   a ninth MOSFET with its gate tied to the drain of the third MOSFET and its source grounded;
   a tenth MOSFET with its source tied to the drain of the ninth MOSFET and its drain tied to the isolation and precharge circuit in the bootstrap capacitance; and
   an eleventh MOSFET with its drain tied to the gate of the tenth MOSFET and to the isolation and precharge circuit, its source grounded and its gate tied to a precharge signal.

3. The high voltage clock generator of claim 2 wherein the isolation and precharge circuit comprises:
   a twelfth MOSFET with itsdrain tied to a supply voltage and its gate tied to a precharge signal;
   a thirteenth MOSFET with its drain tied to the source of the twelfth MOSFET, its gate tied to the second clock generator, and its source grounded;
   a capacitance with a first terminal tied to a first clock signal, and a second terminal tied to the source of the twelfth MOSFET;
   a first depletion MOSFET with its gate tied to the source of the twelfth MOSFET, and its source and drain tied to the first clock generator; and
   a second depletion MOSFET with its drain tied to a supply voltage, its gate tied to the source of the twelfth MOSFET, and its source tied to the bootstrap capacitance and the first clock generator.

4. The high voltage clock generator of claim 1 wherein the second clock generator comprises:

a first MOSFET with its source grounded, and its gate tied to a precharged signal;

a second MOSFET with its source tied to the drain of the first MOSFET, its drain tied to a voltage supply, and its gate tied to a first clock signal;

a third MOSFET with its gate tied to the drain of the first MOSFET and its source grounded;

a fourth MOSFET with its source tied to the drain of the third MOSFET, its drain tied to a voltage supply, and its gate tied to a precharge signal;

a fifth MOSFET with its source tied to the drain of the third MOSFET, and its gate tied to a voltage supply;

a sixth MOSFET with its drain tied to a first clock signal and its gate tied to the drain of the fifth MOSFET;

a seventh MOSFET with its source grounded and its gate tied to the drain of the third MOSFET;

a capacitance with a first terminal tied to the source of the sixth MOSFET and a second terminal tied to the drain of the seventh MOSFET;

an eighth MOSFET with its gate tied to the source of the sixth MOSFET, its source tied to the second terminal of the capacitance, and its drain tied to a supply voltage;

a ninth MOSFET with its gate tied to the drain of the third MOSFET and its source grounded;

a tenth MOSFET with its drain tied to a supply voltage and its gate tied to the first terminal of the capacitance; and an eleventh MOSFET with its drain tied to the gate of the tenth MOSFET and to the isolation and precharge circuit, its source grounded, and its gate tied to a precharge signal.

5. The high voltage clock generator of claim 1 wherein the isolation and precharge circuit comprises:

a first MOSFET with its drain tied to a supply voltage and its gate tied to a precharge signal;

a second MOSFET with its drain tied to the source of the first MOSFET, its gate tied to the second clock generator, and its source grounded;

a capacitance with a first terminal tied to a first clock signal, and a second terminal tied to the source of the first MOSFET;

a first depletion MOSFET with its gate tied to the source of the first MOSFET, and its source and drain tied to the first clock generator; and a second depletion MOSFET with its drain tied to a supply voltage, its gate tied to the source of the first MOSFET, and its source tied to the bootstrap capacitance and the first clock generator.

6. The high voltage clock generator of claim 1 wherein the first clock generator and second clock generator are similar units.

7. The high voltage clock generator of claim 6 wherein the isolation and precharge circuit comprises:

a first MOSFET with its drain tied to a supply voltage and its gate tied to a precharge signal;

a second MOSFET with its drain tied to the source of the first MOSFET, its gate tied to the second clock generator, and its source grounded;

a capacitance with a first terminal tied to a first clock signal, and a second terminal tied to the source of the first MOSFET;

a first depletion MOSFET with its gate tied to the source of the first MOSFET, and its source and drain tied to the first clock generator; and a second depletion MOSFET with its drain tied to a supply voltage, its gate tied to the source of the first MOSFET, and its source tied to the bootstrap capacitance and the first clock generator.

8. A high voltage clock generator comprising:

a first MOSFET with its source grounded, and its gate tied to a precharge signal;

a second MOSFET with its source tied to the drain of the first MOSFET, its drain tied to a voltage supply, and its gate tied to a first clock signal;

a third MOSFET with its gate tied to the drain of the first MOSFET and its source grounded;

a fourth MOSFET with its source tied to the drain of the third MOSFET, its drain tied to a voltage supply, and its gate tied to a precharge signal;

a fifth MOSFET with its source tied to the drain of the third MOSFET, and its gate tied to a voltage supply;

a sixth MOSFET with its drain tied to a first clock signal and its gate tied to the drain of the fifth MOSFET;

a seventh MOSFET with its source grounded and its gate tied to the drain of the third MOSFET;

a capacitance with a first terminal tied to the source of the sixth MOSFET and a second terminal tied to the drain of the seventh MOSFET;

an eighth MOSFET with its gate tied to the source of the sixth MOSFET, its source tied to the second terminal of the capacitance, and its drain tied to a supply voltage;

a ninth MOSFET with its gate tied to the drain of the third MOSFET and its source grounded;

a tenth MOSFET with its source tied to the drain of the ninth MOSFET and its drain tied to the isolation and precharge circuit and bootstrap capacitance;

an eleventh MOSFET with its drain tied to the gate of the tenth MOSFET and to the isolation and precharge circuit, its source grounded, and its gate tied to a precharge signal;

a bootstrap capacitance to drive the load capacitance to a second voltage level;

a twelfth MOSFET with its drain tied to a supply voltage and its gate tied to a precharge signal;

a thirteenth MOSFET with its drain tied to the source of the twelfth MOSFET, its gate tied to the second clock generator, and its source grounded;

a second capacitance with a first terminal tied to a first clock signal, and a second terminal tied to the source of the twelfth MOSFET;

a first depletion MOSFET with its gate tied to the source of the twelfth MOSFET, and its source and drain tied to the first clock generator;

a second depletion MOSFET with its drain tied to a supply voltage, its gate tied to the source of the twelfth MOSFET, and its source tied to the bootstrap capacitance and the first clock generator;

a fourteenth MOSFET with its source grounded, and its gate tied to a precharge signal;

a fifteenth MOSFET with its source tied to the drain of the fourteenth MOSFET, its drain tied to a voltage supply, and its gate tied to a first clock signal;

a sixteenth MOSFET with its gate tied to the drain of the fourteenth MOSFET and its source grounded;

a seventeenth MOSFET with its source tied to the drain of the sixteenth MOSFET, its drain tied to a voltage supply, and its gate tied to a precharge signal;

an eighteenth MOSFET with its source tied to the drain of the sixteenth MOSFET, and its gate tied to a voltage supply;

a nineteenth MOSFET with its drain tied to a first clock signal and its gate tied to the drain of the eighteenth MOSFET;

a twentieth MOSFET with its source grounded and its gate tied to the drain of the sixteenth MOSFET;

a third capacitance with a first terminal tied to the source of the nineteenth MOSFET and a second terminal tied to the drain of the twentieth MOSFET;

a twenty-first MOSFET with its gate tied to the source of the nineteenth MOSFET, its source tied to the second terminal of the third capacitance, and its drain tied to a supply voltage;

a twenty-second MOSFET with its gate tied to the drain of the sixteenth MOSFET and its source grounded;

a twenty-third MOSFET with its drain tied to a supply voltage and its gate tied to the first terminal of the third capacitance; and a twenty-fourth MOSFET with its drain tied to the gate of the twenty-third MOSFET, its source grounded, and its gate tied to a precharge signal.

* * * * *